(12) United States Patent
Liu

(10) Patent No.: US 10,598,546 B2
(45) Date of Patent: Mar. 24, 2020

(54) DETECTING HIGH INTENSITY LIGHT IN PHOTO SENSOR

(71) Applicant: Facebook Technologies, LLC, Menlo Park, CA (US)

(72) Inventor: Xinqiao Liu, Medina, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 46 days.

(21) Appl. No.: 15/983,379

(22) Filed: May 18, 2018

(65) Prior Publication Data

US 2019/0056264 A1 Feb. 21, 2019

Related U.S. Application Data

(60) Provisional application No. 62/546,993, filed on Aug. 17, 2017.

(51) Int. Cl.
| | |
|---|---|
| *G01J 1/18* | (2006.01) |
| *G01J 1/08* | (2006.01) |
| *G01J 1/16* | (2006.01) |
| *H01L 31/0203* | (2014.01) |
| *H04N 5/357* | (2011.01) |

(Continued)

(52) U.S. Cl.
CPC . *G01J 1/18* (2013.01); *G01J 1/08* (2013.01); *G01J 1/1626* (2013.01); *H01L 31/0203* (2013.01); *H04N 5/357* (2013.01); *H01L 27/14643* (2013.01); *H01L 27/3227* (2013.01)

(58) Field of Classification Search
CPC .... G01J 1/18; G01J 1/44; G01J 1/4228; G01J 1/0228; H04N 5/3591; H04N 5/3594; H04N 5/37455; H04N 5/379
See application file for complete search history.

(56) References Cited

U.S. PATENT DOCUMENTS

| | | |
|---|---|---|
| 2006/0023109 A1 | 2/2006 | Mabuchi et al. |
| 2013/0020466 A1 | 1/2013 | Ayers et al. |

(Continued)

FOREIGN PATENT DOCUMENTS

| | | |
|---|---|---|
| EP | 1681856 A2 | 7/2006 |
| KR | 10-0574959 B1 | 4/2006 |

(Continued)

OTHER PUBLICATIONS

PCT International Search Report and Written Opinion, PCT Application No. PCT/US2018/046131, dated Dec. 3, 2018, 12 pages.

(Continued)

*Primary Examiner* — Tony Ko
(74) *Attorney, Agent, or Firm* — Kilpatrick Townsend & Stockton LLP

(57) ABSTRACT

Two separate schemes are used for detecting light intensity in low light conditions and high light conditions. In high light conditions, two threshold voltages are set and the time between the crossing of a sensor voltage at the two threshold voltages is measured to determine the light intensity in the high light conditions. In low light conditions, a comparator is used to compare the voltage level of the sensor voltage relative to a reference voltage that increase over time. The time when the reference voltage reaches the sensor voltage level is detected to determine the light intensity in the low light conditions.

19 Claims, 7 Drawing Sheets

(51) Int. Cl.
*H01L 27/32* (2006.01)
*H01L 27/146* (2006.01)

(56) References Cited

U.S. PATENT DOCUMENTS

2017/0053962 A1    2/2017  Oh et al.
2019/0157330 A1*   5/2019  Sato ..................... H01L 27/146

FOREIGN PATENT DOCUMENTS

KR    10-2015-0095841 A    8/2015
KR    10-2016-0008287 A    1/2016

OTHER PUBLICATIONS

European Extended Search Report, European Application No. 18189100.3, dated Oct. 9, 2018, 9 pages.
Xu, C. et al., "A New Digital-Pixel Architecture for CMOS Image Sensor with Pixel-Level ADC and Pulse Width Modulation Using a 0.18/μm CMOS Technology," 2003 IEEE Conference on Electron Devices and Solid-State Circuits, Dec. 16-18, 2003, pp. 265-268.

* cited by examiner

DETECTING HIGH INTENSITY LIGHT IN PHOTO SENSOR

CROSS REFERENCE TO RELATED APPLICATIONS

This application claims the benefit of U.S. Provisional Application No. 62/546,993 filed Aug. 17, 2017, which is incorporated by reference in its entirety.

BACKGROUND

The present disclosure relates generally to optical sensors, and more particularly, to backside illumination optical sensors in stacked assembly.

Optical sensors are electronic detectors that convert light into an electronic signal. In photography, a shutter is a device that allows light to pass for a determined period of time, exposing the optical sensors to the light in order to capture an image of a scene. Rolling shutter is a method of image capture in which a still picture or each frame of a video is captured by scanning across the scene rapidly in a horizontal or vertical direction. That is, every pixel is not captured at the same time; pixels from different rows are captured at different times. Rolling shutter is mostly used in cell phone sensors. Machine vision, in contrast, uses global shutter where every pixel is captured at the same time.

Most optical sensors use backside illumination. A back-illuminated sensor is a type of digital optical sensor that uses a particular arrangement of imaging elements to increase the amount of light captured, improving low-light performance. A traditional front-illuminated digital camera is constructed similar to the human eye, with a lens at the front and photodetectors at the back. This orientation of the sensor places the active matrix of the digital camera sensor, a matrix of individual picture elements, on its front surface and simplifies manufacturing. The matrix and its wiring, however, reflect some of the light, reducing the signal that is available to be captured. A back-illuminated sensor contains the same elements, but arranges the wiring behind the photocathode layer by flipping the silicon wafer during manufacturing and then thinning its reverse side so that light can hit the photocathode layer without passing through the wiring layer, thereby improving the chance of an input photon being captured.

However, conventional back-illuminated sensors tends to have higher leakage when exposed to light. Also, the photodiode fill factor, or the ratio of light-sensitive area of a pixel to total pixel area, is relatively low. A large fill factor is beneficial because more of the pixel area is used for photocollection, which simultaneously improves signal-to-noise ratio (SNR) and dynamic range. The dynamic range of an image sensor measures how wide of a range of lighting the sensor can accurately capture. The wider the dynamic range of the image sensor, the more details can be shown under low light conditions and thus the more versatile the imaging system becomes. The SNR of an image sensor measures the ratio between the signal and its associated noise. An image sensor with low SNR will have a high amount of noise appearing in the captured image. An image sensor with high SNR can be used in low light conditions.

SUMMARY

Embodiments relate to a pixel in a photo sensor including a photo diode, a floating diffusion point, and a transistor between the photo diode and the floating diffusion point. A gate of the transistor is applied with an intermediate voltage between a turn-off voltage of the transistor and a turn-on voltage of the transistor to transfer charge from the photo diode to the floating diffusion point responsive to an intensity of light incident on the photo diode during an exposure phase exceeding a threshold intensity. The gate of the transistor is applied with the turn-on voltage in a sensing phase subsequent to the exposure phase to transfer the charge from the photo diode to the floating diffusion point.

DETAILED DESCRIPTION OF THE PREFERRED EMBODIMENTS

Reference will now be made in detail to the preferred embodiment, an example of which is illustrated in the accompanying drawings. Whenever possible, the same reference numbers will be used throughout the drawings to refer to the same or like parts.

Embodiments relate to a stacked photo sensor assembly where two substrates are stacked vertically. The two substrates are connected via interconnects at a pixel level to provide a signal from a photodiode at a first substrate to circuitry on a second substrate. A voltage signal corresponding to the amount of charge in the first substrate is generated and processed in the second substrate. Two separate schemes are used for detecting light intensity in low light conditions and high light conditions. In high light conditions, two threshold voltages are set and the time between the crossing of a sensor voltage at the two threshold voltages is measured to determine the light intensity in the high light conditions. In low light conditions, a comparator is used to compare the voltage level of the sensor voltage relative to a reference voltage that increase over time. The time when the reference voltage reaches the sensor voltage level is detected to determine the light intensity in the low light conditions.

Example System Architecture

Figure 1:
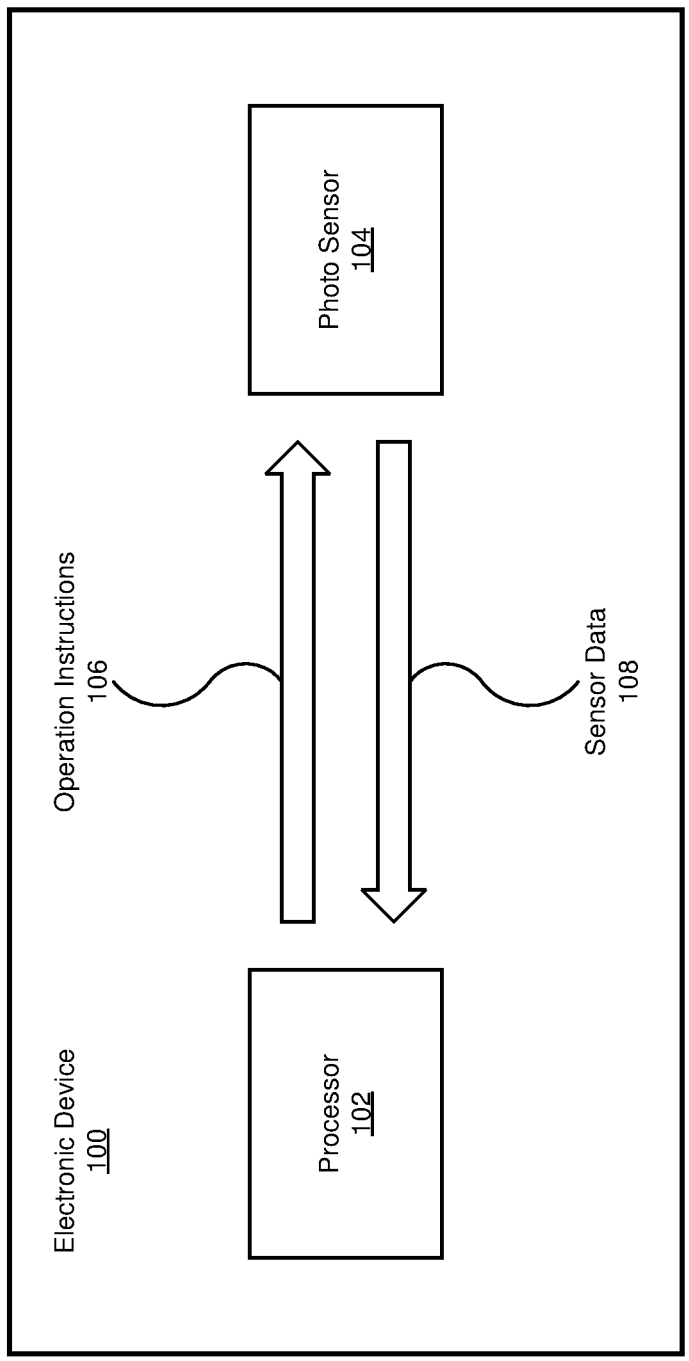
FIG. 1 is a high-level block diagram illustrating an electronic device including a photo sensor, according to one embodiment.

FIG. 1 is a high-level block diagram illustrating the electronic device 100, according to one embodiment. In one embodiment, the electronic device 100 includes, among other components, a processor 102 and a photo sensor 104 that are commutatively coupled. The electronic device 100 may include other components not illustrated in FIG. 1 such as memory and various other sensors.

The processor 102 is an electronic circuit that performs, among others, operations on a data source for providing images. The data source may include the photo sensor 104 that provides sensor data 108. The processor 102 also generates operation instructions 106 that are sent to the photo sensor 104 to cause the photo sensor 104 to perform certain operations. The processing performed by the processor 102 may include various digital signal processing to improve the quality of images or edit the images.

The photo sensor 104 is a circuit that measures intensity of light impinging on the photo sensor 104 on a pixel-by-pixel basis using photoconversion. Measuring light intensity may involve detecting light by a photodiode in a pixel. In response, the pixel performs photoconversion on the detected light into a voltage or current signal. The voltage or current signal representing the intensity of light detected at each pixel may be digitized into sensor data 108, and sent over to the processor 102.

Although not illustrated in FIG. 1, the electronic device 100 may include memory where the sensor data 108 is stored. The electronic device 100 may also include a display interface for sending the sensor data 108 for display on a display device (e.g., liquid crystal display (LCD) or organic light emitting diode (OLED) display).

Figure 2:
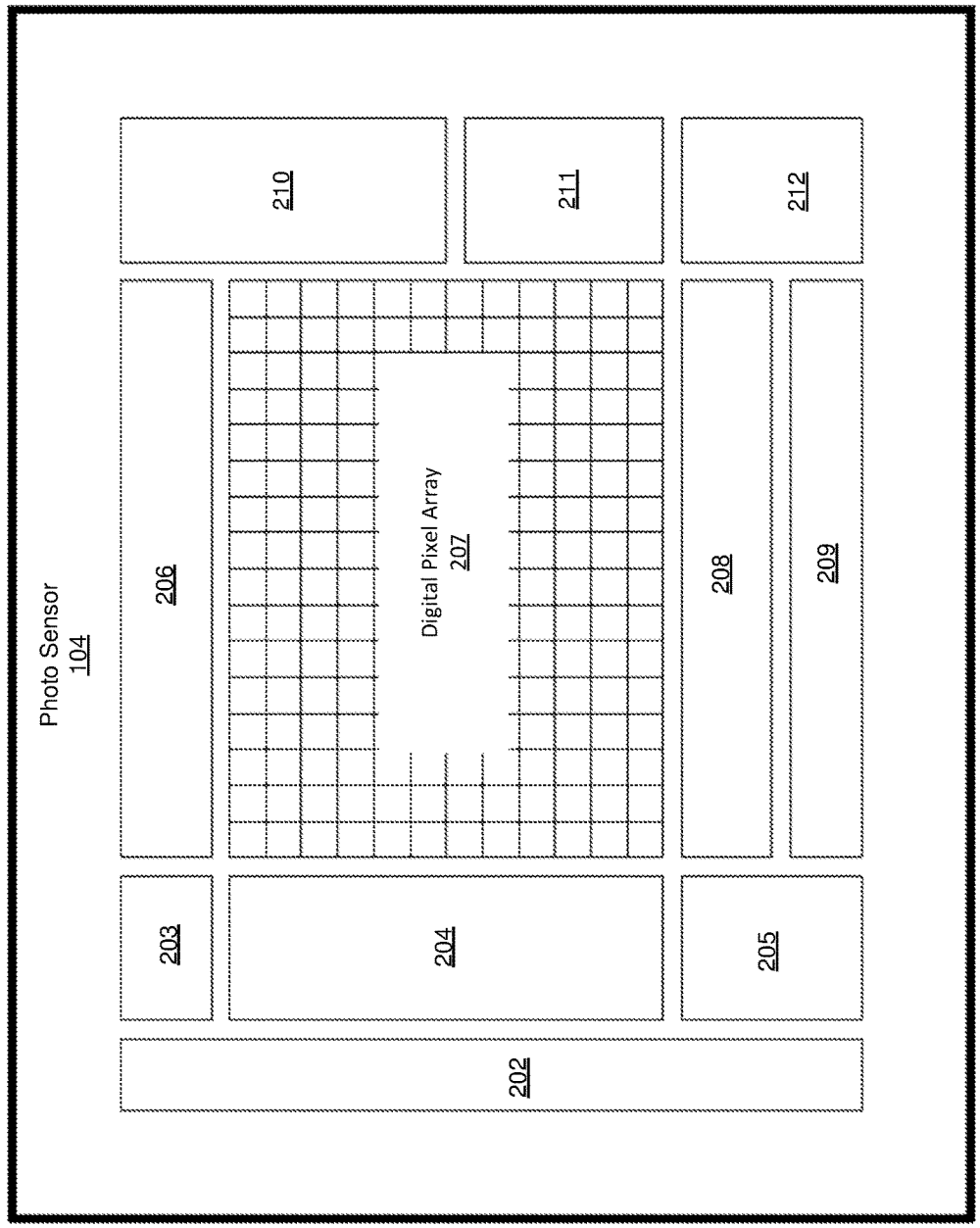
FIG. 2 is a schematic view illustrating the photo sensor of FIG. 1, according to one embodiment.

FIG. 2 is a schematic view illustrating the photo sensor 104, according to one embodiment. The photo sensor 104 includes, among other components, a digital block 202, a global counter 203, a row drivers and global signal drivers module 204, Mobile Industry Processor Interface (MIPI) 205, counter buffers 206, a digital pixel array 207, sense amplifiers 208, a line memory 209, a power conditioner 210, a ramp generation and buffers module 211, and a sense amplification biasing module 212.

The digital block 202 is a circuit that processes digital signals associated with the operation of the photo sensor 104. In one or more embodiments, at least part of the digital block 202 may be provided as part of the digital pixel array 207 instead of being a circuit separate from the digital pixel array 207.

The global counter 203 is a digital sequential logic circuit constructed of cascading flip-flops, and provides counter signals to various components of the photo sensor 104.

The row drivers and global signal drivers module 204 is a circuit that provides signals to rows of pixels via scan lines (not shown). The signal provided to each row of pixels indicates sensing of image signal and/or resetting operations at each row of pixels.

MIPI 205 is a serial interface for transmitting the sensor data 108 from the photo sensor 104 to the processor 102. An MIPI interface typically has a single clock lane and two data lanes (not shown) that carry serial data. These three lanes carry signals on pairs of wires where the signals are often differential.

The counter buffers 206 is a circuit that receives counter signals from the global counter 203, and sends signals to columns of pixels in the digital pixel array 207 to coordinate sensing and resetting operations.

The digital pixel array 207 includes a plurality of pixels. In one embodiment, the digital pixel array is arranged in two dimensions, addressable by row and column. Each pixel is configured to sense light and output a signal corresponding to the intensity of the input light. Each pixel may include components as described below with reference to FIG. 3.

The sense amplifiers 208 are elements in the read circuitry that are used to the read out of the digital signals from the digital pixel array 207. The sense amplifiers 208 sense low power signals from a bitline that represents the intensity of light captured by the pixels in the digital pixel array 207. The sense amplifiers 208 may generate a digital output signal by utilizing an analog-to-digital converter (ADC). In one or more embodiments, at least part of the sense amplifiers 208 may be included in the digital pixel array 207.

The line memory 209 temporarily stores the sensed digital values of the light intensity detected at the digital pixel array 207, as sensed by the sense amplifiers 208 and processed by digital block 202 before sending the digital values to the processor 102 via MIPI 205 as the sensor data 108.

The power conditioner 210 is a circuit that improves the quality of the power that is delivered to components of the photo sensor 104. The power conditioner 210 may maintain and deliver a constant voltage that allows the components of the photo sensor 104 to function properly. In one embodiment, the power conditioner 210 is an AC power conditioner which smooths the sinusoidal AC waveform. In alternate embodiments, the power conditioner 210 is a power line conditioner which takes in power and modifies it based on the requirements of the components connected to the power line conditioner.

The ramp generator and buffers module 211 comprises a ramp generator and buffers. The ramp generator is a function generator that increases its voltage to a particular value. The ramp generator may be used to avoid jolts when changing a load. The buffers provide electrical impedance transformation from one circuit to another to prevent the ramp generator from being affected by the load.

The sense amplification biasing module 212 provides biasing voltage signal to the sense amplifiers 208. The biasing voltage signal is a predetermined voltage for the purpose of establishing proper operating conditions of the sense amplifiers 208 such as a steady DC voltage.

Example Stacked Photo Sensor Assembly

Figure 3:
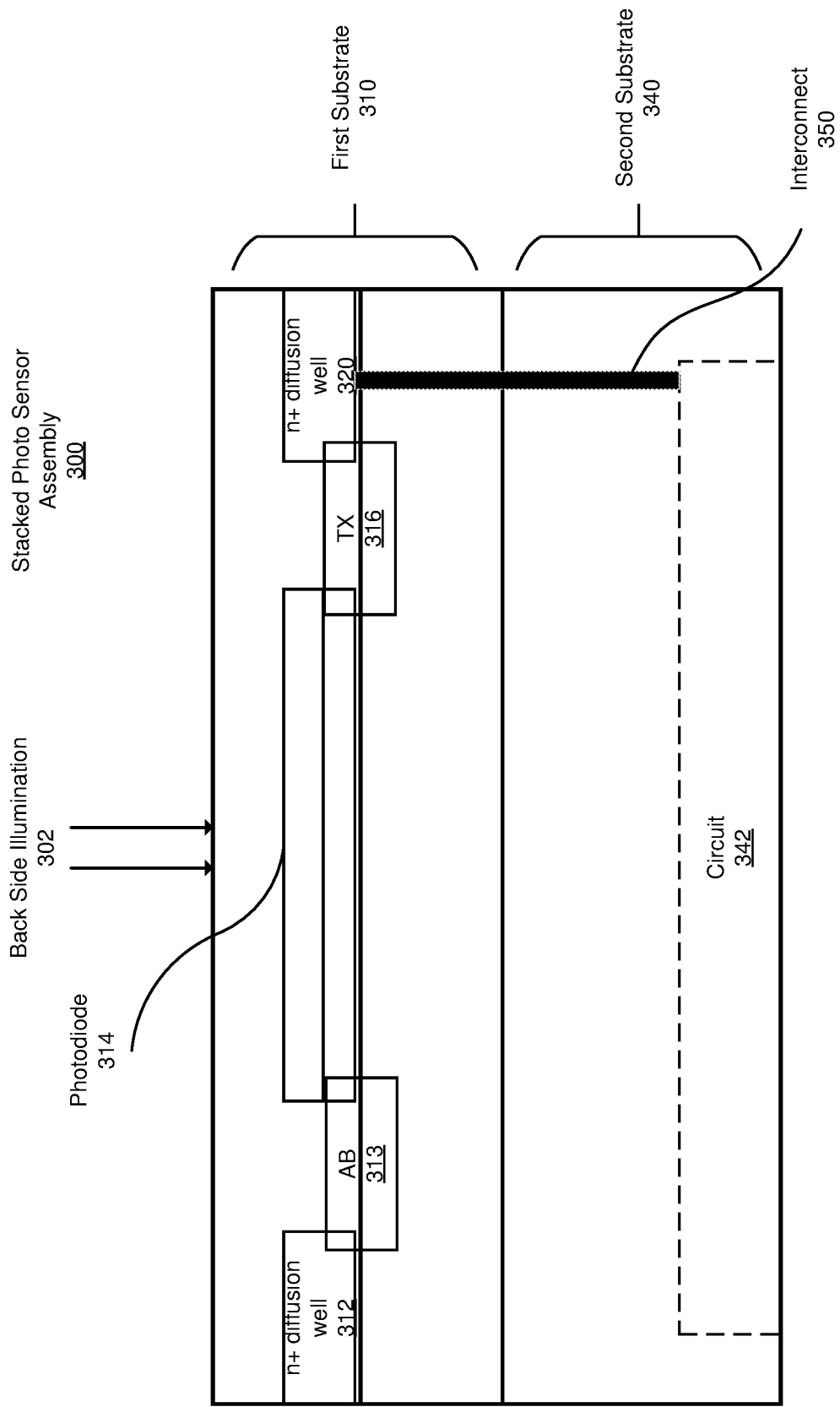
FIG. 3 is a cross-sectional view the photo sensor in a stacked structure, according to one embodiment.

FIG. 3 is a cross-sectional view illustrating the stacked photo sensor assembly 300, according to one embodiment. In one embodiment, the stacked photo assembly includes a first substrate 310 coupled to a second substrate 340. The first substrate 310 may be a back-side illumination 302 sensor that is flipped over and includes, among other components, a first n+ diffusion well 312, a photodiode 314, a transistor AB 313, a transistor TX 316, and a second n+ diffusion well 320.

Each of transistor AB 313 and transistor TX 316 includes an active layer, a drain electrode coupled to the active layer, a photodiode 314 that serves as a source of both transistor AB and transistor TX, an insulation layer over the active layer, and a gate electrode (not shown). By controlling a voltage level at the gates of the transistors AB 313 and the transistor TX 316, the transistors AB 313 and the transistor TX 316 can be turned on or off. The gates of these transistors receive signals from circuits external to the digital pixel array 207.

The first n+ diffusion well 312 is an N doped implant region formed in the first substrate 310. The first n+ diffusion well 312 receives photoelectrons that are transferred from the photodiode 314 when transistor AB 313 is turned on during non-exposure times. This is equivalent to a closed shutter mode in a traditional film camera. The transfer of photoelectrons from the photodiode 314 to the first n+ diffusion well 312 ensures that no photoelectrons are accumulated on the photodiode 314, as the non-exposure times are periods when no signal is generated. The first n+ diffusion well 312 is typically connected to a positive voltage source, for example VDD, so the photoelectrons are drained away. During an exposure time, which is equivalent to the shutter open mode in a film camera, both transistor AB 313 and transistor TX 316 are turned off and the photoelectrons are initially stored inside the photodiode 314. At the end of exposure, transistor TX 316 is turned on. As a result, the charge stored in the photodiode 314 is transferred to the second n+ diffusion well 320.

The photodiode 314 is a semiconductor device that converts light into an electric current. Current is generated when photons are absorbed in the photodiode 314. The photodiode 314 may be a p-n junction or PIN structure. When the intensity of light through back-side illumination 302 is higher, the amount of charge accumulated on the photodiode 314 is high. Similarly, when the intensity of light through back-side illumination 302 is lower, the amount of charge accumulated on the photodiode 314 is low.

The interconnect 350 may be a pixel level direct interconnect from the second n+ diffusion well 320 to a circuit 342 in the second substrate 340. In some embodiments, the interconnect 350 may be a pixel level direct interconnect from the output of an amplifier (not shown in FIG. 3) in the first substrate 310 to the circuit 342 in the second substrate 340. The amplifier acts as a buffer and isolates a floating diffusion point from the interconnect 350, as there is high leakage current and parasitic capacitance associated with the interconnect 350. The amplifier and floating diffusion point are described below with reference to FIG. 4 in detail. In one embodiment, the interconnect 350 transmits a voltage signal that reflects the amount of charge transferred from the photodiode 314 to the second n+ diffusion well 320. In alternative embodiments, the interconnect 350 transmits a current signal that reflects the amount of charge transferred from the photodiode 314 to the second n+ diffusion well 320. The interconnect 350 carries the voltage signal to the circuit 342 for further processing such as sampling and analog-to-digital conversion. In still other embodiments, the stacked photo sensor assembly 300 may include additional interconnects that also transmit signals from the circuit 342 of the second substrate 340 to the first substrate 310. For example, signals for controlling transistor AB 313 and transistor TX 316 may be transmitted from the circuit 342 via these additional interconnects.

Embodiments move various circuit components provided on the first substrate 310 in conventional photo sensors to the second substrate 340, and connect the circuits of the second substrate 340 to the components in the first substrate 310 via the pixel level interconnect 350. The various circuit components moved to the second substrate 340 may include, among others, switches, amplifiers and current source. In this way, the area occupied by components in the first substrate 310 can be beneficially reduced and the fill factor can be increased.

Example Circuitry of a Pixel of the Photo Sensor

Figure 4:
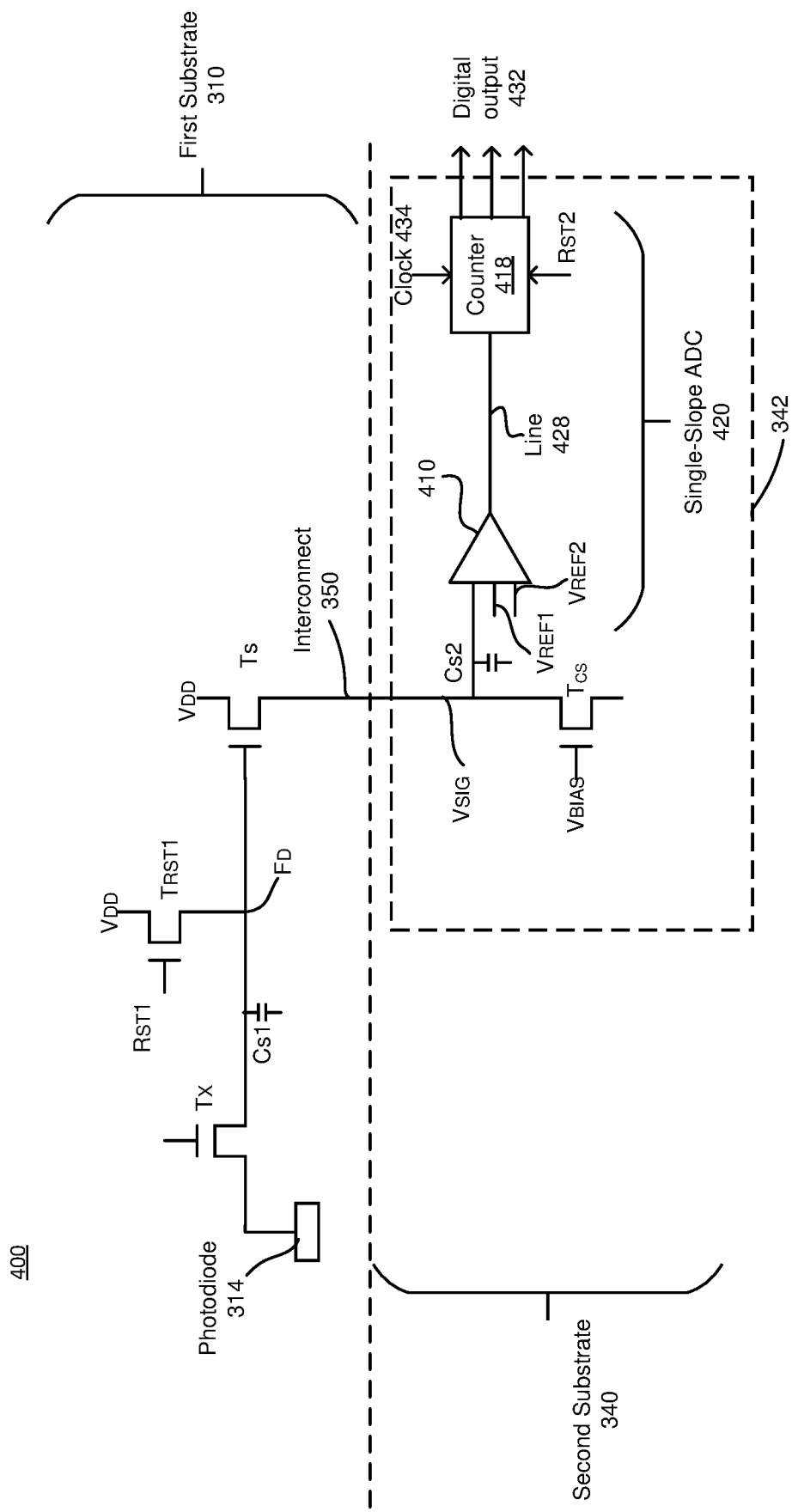
FIG. 4 is a circuit diagram illustrating a pixel of the photo sensor, according to one embodiment.

FIG. 4 is a circuit diagram illustrating a pixel 400 of the photo sensor 104, according to one embodiment. In the embodiment of FIG. 4, the first substrate 310 includes, among other components, the photodiode 314, a transistor TX, a first reset transistor $T_{RST1}$, and an amplifier $T_S$. Parasitic capacitance is present in a first capacitor Cs1 in the first substrate 310 between the transistor TX and the first reset transistor $T_{RST1}$. The operation of photodiode 314 and transistor TX is described above with reference to FIG. 3.

During the exposure phase of the operation, the gate voltage of the transistor TX is maintained at an intermediate voltage that neither turns on nor turns off the transistor TX. Specifically, the intermediate voltage herein refers to 0.3V to 0.7V. In this range, the charge accumulated in the photodiode 314 may move to the floating diffusion point $F_D$. The intermediate voltage refers to a voltage that is between an active voltage and inactive voltage of the transistor TX. The potential underneath the transistor TX gate serves as a barrier between the photodiode 314 and the floating diffusion point $F_D$. If the transistor TX gate is connected to zero or negative voltage, the barrier is high, and more charge is accumulated inside the photodiode 314. If the transistor TX gate is connected to a very positive voltage (e.g., 2.5V to 3.3V), the transistor TX gate is fully turned on, and there is no barrier. The intermediate voltage results in a medium barrier where all charge generated by a low level light is accumulated inside the photodiode 314 while for bright light, charge flows over the barrier to accumulate on the floating diffusion point $F_D$ once the photodiode 314 is filled up.

By placing the gate voltage at the intermediate voltage, the charge moves from the photodiode 314 to the second n+ diffusion well 320 when the light intensity of the back side illumination 302 exceeds a certain threshold. If the light intensity of the back side illumination 302 does not exceed a threshold, the charge accumulates within the photodiode 314 without transferring over to the second n+ diffusion well 320. Conversely, in a sensing phase after the exposure phase, the transistor TX is fully turned on to transfer the charge accumulated in the photodiode 314 to the second n+ diffusion well 320.

The voltage level at the floating diffusion point $F_D$ serves as a proxy that indicates the duration and/or intensity of light exposure of the photodiode 314 during an exposure phase. The floating diffusion point $F_D$ is connected to the second n+ diffusion well 320. As the charge is transferred from the photodiode 314 to the floating diffusion point $F_D$ via the transistor TX, the voltage level at the floating diffusion point $F_D$ is decreased. When the duration and/or intensity of light exposure of the photodiode 314 during the exposure phase is increased, the voltage level at the floating diffusion point $F_D$ is also decreased. If the duration and/or intensity of light exposure of the photodiode 314 is below a certain level that is set by the transistor TX gate intermediate voltage, the voltage level at the floating diffusion point $F_D$ will not change as there is no charge transferred from photodiode 314 to the floating diffusion point $F_D$.

The first reset transistor $T_{RST1}$ functions to reset the voltage at floating diffusion point $F_D$ when the first reset transistor $T_{RST1}$ is turned on. The first reset transistor $T_{RST1}$ is turned on when a reset signal RST1 is received at the gate of the first reset transistor $T_{RST1}$ after each cycle of exposure and sensing. The drain of the first reset transistor $T_{RST1}$ is connected to a voltage source VDD. The source of the first reset transistor $T_{RST1}$ is connected to the floating diffusion point $F_D$.

The amplifier $T_S$ is a source follower amplifier that amplifies its gate signal to generate a voltage signal $V_{SIG}$ that is transmitted to the circuit 342. The gate of the amplifier $T_S$ is connected to the floating diffusion point $F_D$. The drain of the amplifier $T_S$ is connected to a voltage source VDD. The source of the amplifier $T_S$ is connected to the interconnect 350. The voltage signal $V_{SIG}$ corresponds to a voltage level at the source terminal of the amplifier $T_S$ as defined by the voltage level at the floating diffusion point $F_D$.

The circuit 342 is provided in the second substrate 340. The circuit receives the voltage signal $V_{SIG}$ via the interconnect 350, processes the voltage signal $V_{SIG}$, and generates a digital output 432 indicating the intensity and/or duration of the light to which the photodiode 314 was exposed.

The circuit 342 may include, among other components, transistor $T_{CS}$, a comparator 410, and a counter 418. The transistor $T_{CS}$ operates as a current source when turned on. In one embodiment, the gate of the current source $T_{CS}$ is applied with a pulse of bias voltage $V_{BIAS}$ throughout exposure phases and sensing phases of the pixel operation. The drain of the current source $T_{CS}$ is connected to the interconnect 305 and the source of the current source $T_{CS}$ is grounded. Parasitic capacitance is present in a second capacitor Cs2 in the second substrate 340 between the current source $T_{CS}$ and the comparator 410.

When the light intensity received at the photodiode 314 is above the threshold, the charge transfers over to the floating diffusion point $F_D$ during the exposure phase because the transistor Tx is placed at the intermediate voltage. As a result, the gate voltage at the amplifier $T_S$ gradually drops, causing the voltage signal $V_{SIG}$ at the interconnect 305 to gradually drop.

The comparator 410 and the counter 418 in combination function as a single-slope analog-to-digital converter (ADC) that produces the digital output 432 that represents the rate of decline in the voltage signal $V_{SIG}$, which in turn, indicates the intensity and/or duration of light incident on the photodiode 314, as described below in detail with reference to FIGS. 5 and 6. After its operation, the comparator 410 may be reset by providing reset signal RST2 to the counter 418. Providing the reset signal RST2 to the counter 418 resets the counted value at the counter 418 back to zero.

The comparator 410 detects times at which the voltage signal $V_{SIG}$ reaches two reference voltages. For this purpose, the comparator 410 receives the voltage signal $V_{SIG}$ at a first terminal via the interconnect 350, first reference voltage $V_{REF1}$ at a second terminal and a second reference voltage $V_{REF2}$ at a third terminal. After the comparator 410 detects that the voltage signal $V_{SIG}$ reached $V_{REF1}$ or $V_{REF2}$, the comparator 410 sends a triggering signal over line 428 to the counter 418.

The counter 418 counts the number of clock cycles for the voltage signal $V_{SIG}$ to reach the second reference voltage $V_{REF2}$ starting from the first reference voltage $V_{REF1}$. The counter 418 is commutatively coupled to the comparator 410 by line 428, receives a clock signal 434 and a reset signal RST2, and outputs a digital output 432. In one embodiment, the counter 418 starts counting responsive to receiving a first triggering signal and stops counting responsive to receiving a second triggering signal. The digital output provided by the counter 418 may be a binary value. The digital output may be used to compute the slope of $V_{SIG}$, which directly corresponds to the intensity of light incident on the photodiode.

Example Pixel Operation

The pixel structure of the present disclosure is configured to measure high intensity light and low intensity light using different mechanisms during different phases (i.e. exposure phase and sensing phase). During the exposure phase, the pixel structure measures high intensity light while the same pixel structure measure lower intensity light.

Figure 5:
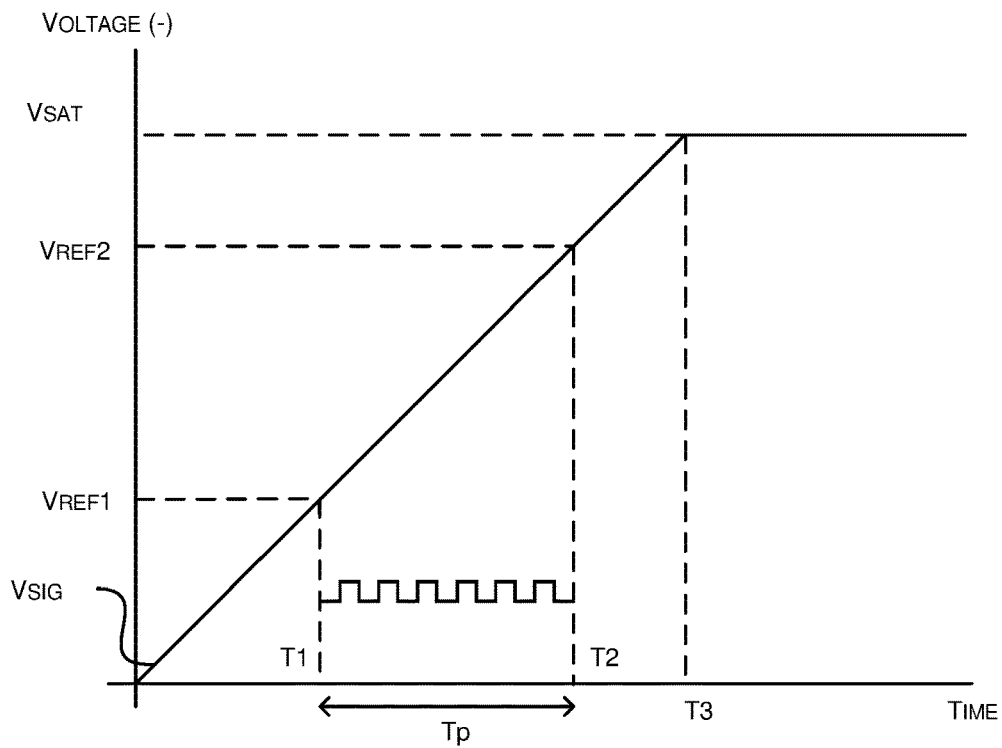
FIGS. 5 and 6 are graphs illustrating change in a voltage signal during an exposure phase when the pixel is exposed to high intensity light, according to one embodiment.
Figure 6:
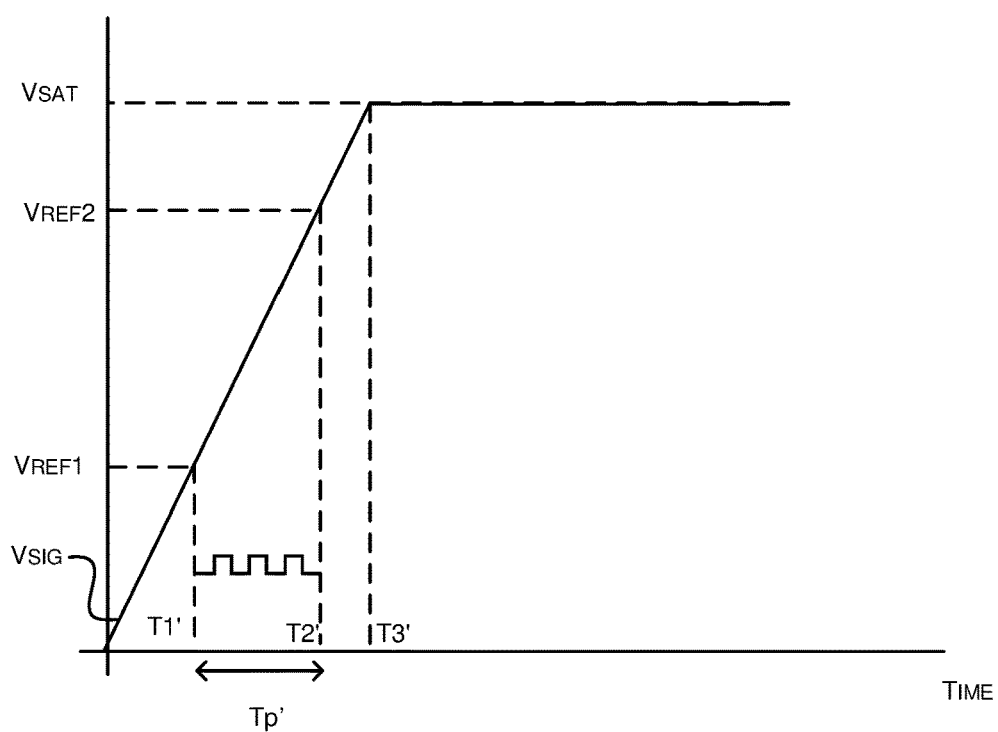

FIGS. 5 and 6 are graphs illustrating measuring of the high light intensity when during the exposure phase, according to one embodiment. In the exposure phase, as the voltage signal $V_{SIG}$ drops, the comparator 410 compares the voltage signal $V_{SIG}$ relative to two reference voltages, first reference voltage $V_{REF1}$ and second reference voltage $V_{REF2}$. When the voltage $V_{SIG}$ reaches the first reference voltage $V_{REF1}$, the comparator 410 sends a starting trigger signal to counter 418 over line 428 so that the counter 418 can start counting based on clock signal 434 received at the counter 418. Conversely, when the voltage signal $V_{SIG}$ reaches the second reference voltage $V_{REF2}$, the comparator 410 sends a stop signal to the counter 418 over line 428 to stop the counting. Based on the number of clock cycles between the two signals sent by the comparator 410 (as indicated by a counted value at the counter 418), the slope of the voltage signal $V_{SIG}$ line can be determined.

Taking the example of FIG. 5, the voltage signal $V_{SIG}$ gradually drops and reaches the first reference voltage $V_{REF1}$ at time T1 and then reaches the second reference voltage $V_{REF2}$ at time T2. Subsequently, the voltage signal $V_{SIG}$ further drops at time T3 to saturation voltage $V_{SAT}$ indicating that the first capacitor Cs1 at the floating diffusion point $F_D$ is fully saturated and the voltage signal $V_{SIG}$ is too low to be read out by the amplifier $T_S$). The period Tp indicates the time difference between T1 and T2.

If the slope of the voltage signal $V_{SIG}$ line is steeper as shown in FIG. 6 (i.e., the intensity of light incident on the photo diode is greater), the voltage signal $V_{SIG}$ reaches the first reference voltage $V_{REF1}$ and the second reference voltage $V_{REF2}$ at times T1' and T2', respectively. T1' and T2' are faster than T1 and T2 of FIG. 5. Further, the time period Tp' between T1' and T2' is shorter than the time period Tp between T1 and T2 of FIG. 5.

Therefore, by measuring the time difference between the time at which the voltage signal $V_{SIG}$ drops to the first reference voltage $V_{REF1}$ and the time at which the voltage signal $V_{SIG}$ drops to the second reference voltage $V_{REF2}$, the intensity of light incident on the photodiode 314 can be determined even if the photodiode 314 is saturated before the end of the exposure phase.

Although embodiments are primarily described above with reference to using a comparator 410 and a counter 418, various other types of circuits may be used to measure the slope of voltage signal $V_{SIG}$.

When the intensity of light incident on the photodiode 314 does not exceed the threshold, the charge accumulated remains in the photodiode 314 and is not transferred to the second n+ diffusion well 320 during the exposure phase. Therefore, there is no change left in the voltage at the floating diffusion point $F_D$ and no decrease in the voltage signal $V_{SIG}$ is detected during the exposure phase. In this case, the voltage signal $V_{SIG}$ changes only after the transistor TX is fully turned on at a sensing phase subsequent to the exposure phase. When the transistor TX is turned on, the voltage at the floating diffusion point $F_D$ decreases to a certain level from its initial reset voltage level and sets the gate voltage of the amplifier $T_S$ to a certain voltage. In response, the source terminal of the amplifier $T_S$ also reaches a certain voltage level.

Figure 7:
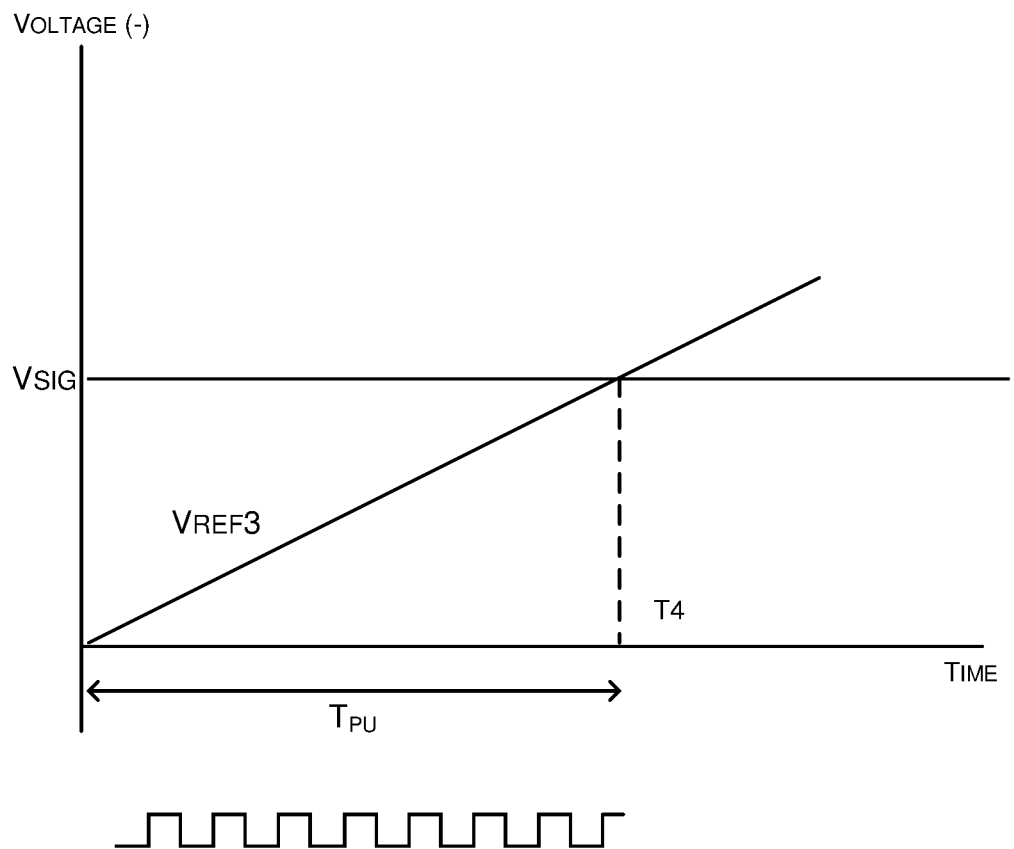
FIG. 7 is a graph illustrating change in the voltage signal in a sensing phase, according to one embodiment.

FIG. 7 is a graph illustrating measuring of the voltage signal $V_{SIG}$ level after the amplifier $T_S$ is turned on in the sensing phase, according to one embodiment. Contrary to FIGS. 5 and 6, the voltage signal $V_{SIG}$ at interconnect 350 remains relatively stable throughout the sensing phase subsequent to the exposure phase.

In the sensing phase, the comparator 410 is provided with the signal voltage $V_{SIG}$ at the first terminal and third reference voltage $V_{REF3}$ signal at a second terminal. In the embodiment of FIG. 7, $V_{REF3}$ is a ramp signal that sweeps from the minimum expected $V_{SIG}$ value to the maximum $V_{SIG}$ value. The third terminal of the comparator 410 is not used and placed in a high impedance state. At the start of the sensing phase, the counter 418 is turned on. While the counter 418 is running based on the clock signal 434, the third reference voltage $V_{REF3}$ signal is gradually increased. When the third reference voltage $V_{REF3}$ signal reaches the voltage signal $V_{SIG}$ at time T4, the counter 418 produces a stop signal over line 428 that stops the counter 418. The counter value of the counter 418 represents time period $T_{PU}$ between the starting time of the sensing phase and a time at which the third reference voltage $V_{REF3}$ signal to reach the voltage signal $V_{SIG}$ voltage level. If the voltage signal $V_{SIG}$ is higher, the higher the counter value would be. Hence, by detecting the counter value in the sensing phase, the voltage level of the voltage signal $V_{SIG}$ can be determined, which in turn enables the measuring of the light intensity below the threshold level.

The reference voltage $V_{REF3}$ may be provide by a signal generator (not shown). Although the embodiment of FIG. 7 uses the reference voltage $V_{REF3}$ that increase linearly, the reference voltage $V_{REF3}$ may increase in a non-linear manner in other embodiments.

Figure 8:
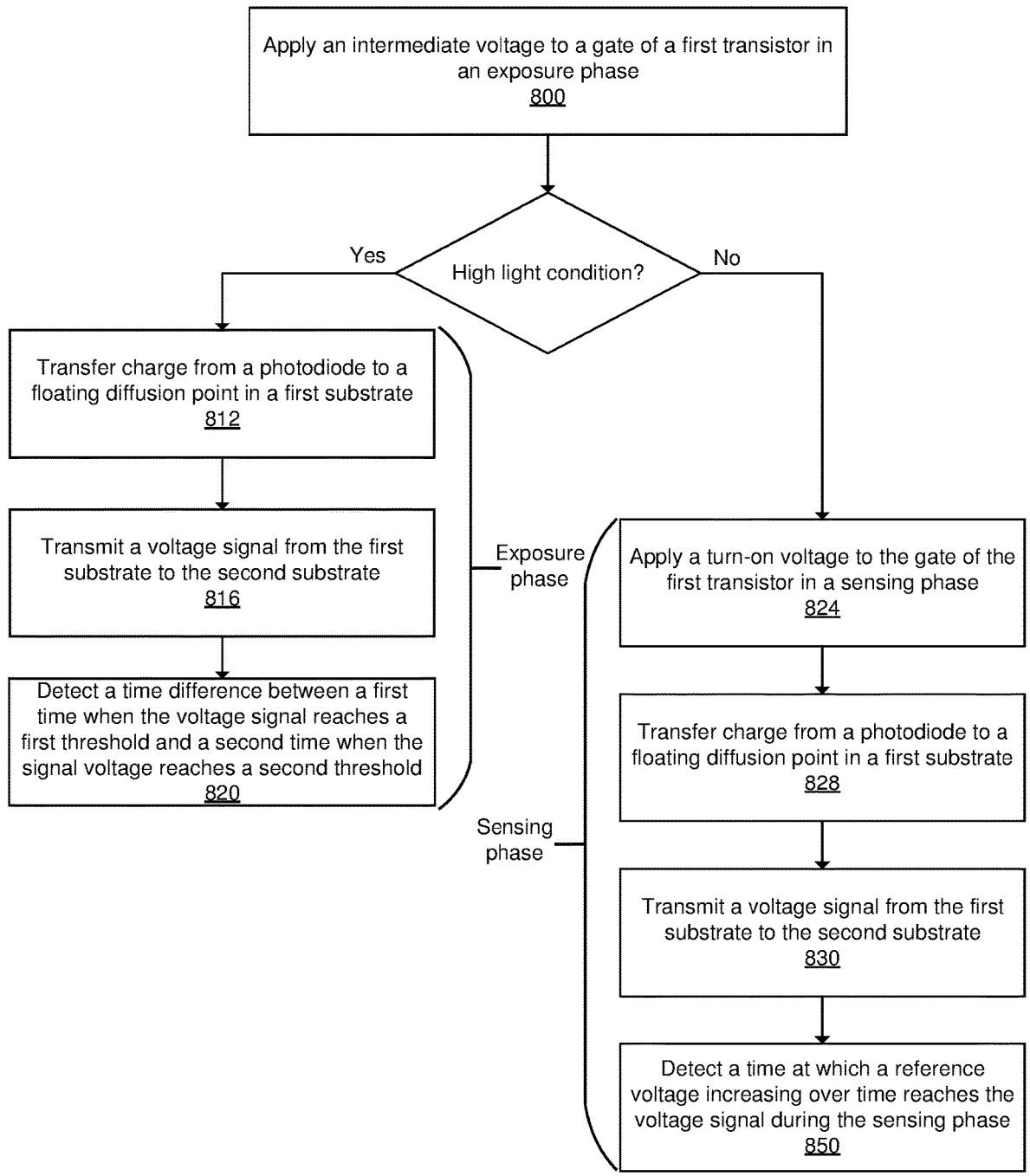
FIG. 8 is a flowchart illustrating a method of detecting light intensity in low light conditions and high light conditions, according to one embodiment.

FIG. 8 is a diagram illustrating a method of detecting light intensity in low light conditions and high light conditions, according to one embodiment. An intermediate voltage is applied 800 to the gate of a transistor TX in an exposure phase that neither turns on nor turns off the transistor TX.

By placing the gate voltage at the intermediate voltage, charge moves from the photodiode to the second n+ diffusion well when the light intensity of the back side illumination exceeds a certain threshold. In high light conditions, the light intensity received at the photodiode is above the threshold. As a result, charge from the photodiode is transferred 812 to a floating diffusion point $F_D$ in a first substrate.

A pixel level interconnect transmits 816 a voltage signal $V_{SIG}$ from the first substrate to the second substrate. The voltage signal $V_{SIG}$ represents an amplified version of a voltage at the floating diffusion point $F_D$. The circuit receives the voltage signal $V_{SIG}$ via the pixel level interconnect, processes the voltage signal $V_{SIG}$, and generates a digital output indicating the intensity and/or duration of the light to which the photodiode was exposed, as described in detail below.

The circuit in the second substrate detects 820 a time difference Tp between a first time T1 when the voltage signal $V_{SIG}$ reaches a first threshold and a second time T2 when the voltage signal $V_{SIG}$ reaches a second threshold different from the first threshold. The comparator in the second substrate generates a first output at the first time T1 at which the voltage signal $V_{SIG}$ corresponds to a first reference voltage $V_{REF1}$ and transmits the first output to the counter at the first time T1. The comparator also generates a second output at the second time T2 at which the voltage signal $V_{SIG}$ corresponds to the second reference voltage $V_{REF2}$ which is higher than the first reference voltage $V_{REF1}$ and transmits the second output to the counter at the second time T2. The counter counts a number of clock pulses between the first time T1 and the second time T2.

In a sensing phase subsequent to the exposure phase, a turn-on voltage is applied 824 to the gate of the transistor TX to place the transistor TX in a saturation state.

Charge from the photodiode is transferred 828 to the floating diffusion point $F_D$ in the first substrate when the intensity of light incident on the photodiode during the exposure phase exceeds a threshold intensity. If the light intensity does not exceed the threshold intensity, the charge accumulates within the photodiode without transferring over to the floating diffusion point $F_D$.

The pixel level interconnect transmits 830 the voltage signal $V_{SIG}$ from the first substrate to the second substrate. The circuit detects 850 a time at which a reference voltage $V_{REF1}$ increasing over time reaches the voltage signal $V_{SIG}$ during the sensing phase. The voltage signal $V_{SIG}$ remains relatively stable in the sensing phase subsequent to the exposure phase. The comparator is provided with the voltage signal $V_{SIG}$ and the first reference voltage $V_{REF1}$. At the start of the sensing phase, the counter is turned on. While the counter is running based on the clock signal, the first reference voltage $V_{REF1}$ is gradually increased. When the first reference voltage $V_{REF1}$ reaches the voltage signal $V_{SIG}$ at time T4, the counter produces a latch signal over line that stops the counter.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A pixel in a photo sensor, comprising:
   a photodiode,
   a floating diffusion point, and
   a transistor between the photodiode and the floating diffusion point, a gate of the transistor applied with an intermediate voltage between a turn-off voltage of the transistor and a turn-on voltage of the transistor to transfer charge from the photodiode to the floating diffusion point responsive to an intensity of light incident on the photodiode during an exposure phase exceeding a threshold intensity, the gate of the transistor applied with the turn-on voltage in a sensing phase subsequent to the exposure phase to transfer the charge from the photodiode to the floating diffusion point.

2. The pixel of claim 1, wherein the photodiode, the floating diffusion point and the transistor are included in a portion of a first substrate.

3. The pixel of claim 2, further comprising a second substrate;
   wherein a portion of a second substrate includes a circuit coupled to a conductive line, the circuit configured to:
   detect a time difference between a first time when a signal voltage reaches a first threshold and a second time when the signal voltage reaches a second threshold different from the first threshold, the signal voltage representing an amplified version of a voltage at the floating diffusion point, and
   detect a time at which a reference voltage increasing over time reaches the signal voltage, during the sensing phase; and
   a pixel level interconnect between the floating diffusion point and the conductive line to transmit the signal voltage.

4. The pixel of claim 3, wherein the first substrate further comprises:
   a first reset transistor configured to reset a voltage at the floating diffusion point responsive to turning on the first reset transistor after the exposure phase; and
   an amplifier having an input terminal connected to the floating diffusion point and an output terminal connected to the pixel level interconnect.

5. The pixel of claim 4, wherein the amplifier is a source follower transistor.

6. The pixel of claim 3, wherein the second substrate further comprises:
   an analog-digital converter (ADC) having an input terminal connected to the pixel level interconnect; and
   a current source coupled to the pixel level interconnect.

7. The pixel of claim 6, wherein the ADC comprises:
   a comparator configured to generate a first output at a first time at which the signal voltage corresponds to a first reference voltage and a second output at a second time at which the signal voltage corresponds to a second reference voltage lower than the first reference voltage; and a counter coupled to the comparator to receive the first output and the second output, the counter configured to count a number of clock pulses between the first time and the second time.

8. The pixel of claim 6, wherein the current source comprises another a transistor having a gate applied with a bias voltage during part of the sensing phase.

9. The pixel of claim 1, wherein the floating diffusion point is configured to reset to a reset voltage after the sensing phase.

10. A method for operating a pixel, the method comprising:

applying an intermediate voltage to a gate of a first transistor in an exposure phase, the intermediate voltage between a turn-off voltage of the first transistor and a turn-on voltage of the first transistor;

applying a turn-on voltage to the gate of the first transistor in a sensing phase subsequent to the exposure phase; and transferring charge from a photodiode to a floating diffusion point in a first substrate responsive to an intensity of light incident on the photodiode during the exposure phase exceeding a threshold intensity.

11. The method of claim 10, the method further comprising:

transmitting by a pixel level interconnect a signal voltage from the first substrate to a second substrate, the signal voltage representing an amplified version of a voltage at the floating diffusion point.

12. The method of claim 11, further comprising detecting a rate of increase or decrease in the signal voltage by a circuit in a second substrate during the exposure phase.

13. The method of claim 12, wherein the circuit comprises an analog-to-digital converter (ADC).

14. The method of claim 12, wherein the rate of increase or decrease in the signal voltage is detected by determining a time difference between a first time when the signal voltage reaches a first threshold and a second time when the signal voltage reaches a second threshold different from the first threshold.

15. The method of claim 14, wherein the time difference is determined by:

generating by a comparator in the second substrate a first output at a first time at which the signal voltage corresponds to a first reference voltage;

transmitting the first output from the comparator to a counter at the first time;

generating by the comparator a second output at a second time at which the signal voltage corresponds to a second reference voltage higher than the first reference voltage;

transmitting the second output from the comparator to the counter at the second time; and counting by the counter a number of clock pulses between the first time and the second time.

16. The method of claim 10, the method further comprising:

resetting a voltage at the floating diffusion point responsive to turning on a first reset transistor after the exposure phase.

17. The method of claim 10, further comprising:

applying a bias voltage to a gate of a current source during part of the sensing phase.

18. The method of claim 10, further comprising:

resetting the floating diffusion point after the sensing phase.

19. The method of claim 11, further comprising detecting a time at which a voltage level of a varying reference voltage coincides with a voltage level of the signal voltage, during the sensing phase.

* * * * *